(12) United States Patent
Oguchi et al.

(10) Patent No.: US 6,288,903 B1
(45) Date of Patent: Sep. 11, 2001

(54) IC CARD CONNECTOR GROUNDING STRUCTURE

(75) Inventors: Wataru Oguchi; Kazuki Satou, both of Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/334,525

(22) Filed: Jun. 16, 1999

(30) Foreign Application Priority Data

Jun. 22, 1998 (JP) .................................. 10-174418

(51) Int. Cl.$^7$ .............................. H05K 5/00; H05K 7/14; H05K 9/00
(52) U.S. Cl. ........................ 361/753; 361/799; 361/800; 361/816
(58) Field of Search ..................................... 439/607, 609; 361/212, 220, 753, 799, 800, 816, 818, 752, 756, 759, 796, 801, 802

(56) References Cited

U.S. PATENT DOCUMENTS

| | | | |
|---|---|---|---|
| 5,288,247 | * 2/1994 | Kaufman | 439/607 |
| 5,725,394 | 3/1998 | Banakis et al. | |
| 5,795,190 | * 8/1998 | Ono | 439/607 |
| 6,077,119 | * 6/2000 | Yu et al. | 439/607 |

FOREIGN PATENT DOCUMENTS 2553438   7/1997 (JP) .

* cited by examiner

*Primary Examiner*—Jeffrey Gaffin
*Assistant Examiner*—Phuong T. Vu
(74) *Attorney, Agent, or Firm*—Brinks Hofer Gilson & Lione

(57) ABSTRACT

An IC card connector grounding structure has an IC card connector having a housing made of an insulating material, in which a plurality of pin terminals are held, and a shield cover mounted on the upper surface of the housing; and a circuit board having a ground circuit pattern, for mounting the IC card connector. The shield cover is grounded in contact with the circuit pattern.

4 Claims, 4 Drawing Sheets

IC CARD CONNECTOR GROUNDING STRUCTURE

BACKGROUND OF THE INVENTION

1. Field of the Invention

The present invention relates to an IC card connector grounding structure suitable for use in a computer and others.

2. Related Art

Referring to FIGS. 8 and 9, a conventional IC card connector ground structure will be explained. An IC card connector 31 is comprised of a housing 33 made of an insulating material fitted with a plurality of pin terminals 32, and a shield cover 34 made of a metal plate attached on the upper surface of the housing 33.

The housing 33 has a stepped portion 33a provided on the corner portion of the upper surface, and a housing section 33b provided at front; in the housing 33 a pin terminal 32 is embedded, projecting out into the housing section 33b.

The shield cover 34 has a spring arm portion 34b provided at the center of the upper surface of the top plate section 34a, and a stepped portion 34c provided at the rear corner, formed one step lower than the top plate section 34a.

The shield cover 34 is attached on the upper surface of the housing 33, with the stepped portion 34c positioned at the stepped portion 33a of the housing 33, thus making up the IC card connector 31.

The IC card connector 31 stated above is mounted and used in an electronic apparatus such as a computer and others by mounting the IC card connector 31 on an electronic apparatus circuit board 35 on which an unillustrated circuit pattern is formed, and by screwing a nut 37 on a screw 36 after insertion of the screw 36 into the stepped portion 34c of the circuit board 35, the housing 33, and the shield cover 34.

Then, when the IC card connector 31 is mounted, the head of the screw 36 contacts the ground circuit pattern, and the shield cover 34 is grounded to the circuit pattern through the screw 36. The pin terminal 32 is in connection with the circuit pattern.

The IC card connector 31 stated above is so designed that an IC card 38 for use in communications and others through LAN and modem can be inserted and extracted. The IC card 38, when inserted into the IC card connector 31, is connected to the pin terminal 32 and attached with the pressure of the spring arm portion 34b as shown in FIG. 8.

The IC card connector 31 stated above is used for high-speed transmission in communications and others. Grounding the shield cover 34 to the circuit pattern is effected through the screw 36, which, however, generates an inductance component by the screw 36, producing noise during high-speed transmission and accordingly deteriorating the transmission performance.

The head of the screw 36 contacting the circuit pattern has little contact surface area, so that reliable grounding and good high-speed transmission characteristic can not be achieved.

In the conventional IC card connector grounding structure, the nut 37 is screwed on the screw 36 after insertion of the screw 36 into the circuit board 35, the housing 33, and the shield cover 34, and the shield cover 34 is grounded to the circuit pattern through the screw 36. The grounding structure, therefore, has such a problem that inductance component is generated by the screw 36, producing noise during high-speed transmission to thereby result in deteriorated transmission performance.

Since the head of the screw 36 contacts the circuit pattern as previously stated, there is little contact surface area, so that reliable grounding and good high-speed transmission characteristic can not be achieved.

SUMMARY OF THE INVENTION

As a first arrangement of solution to the above-described problem, the grounding structure comprises an IC card connector having a housing made of an insulating material for holding a plurality of pin terminals, and a shield cover attached on the upper surface of the housing, and a circuit board with a ground circuit pattern for mounting the IC card connector; the shield cover being grounded in contact with the circuit pattern.

As a second arrangement of solution, the shield cover is provided with mounting legs, which are held in contact with the circuit pattern. The mounting legs are attached by mounting fixtures to the circuit board.

As a third arrangement of solution, the mounting fixture employed includes a screw and a nut. The nut is screwed onto the screw inserted in a mounting hole provided in the mounting leg and a mounting hole provided in the circuit board, to thereby attach the shield cover to the circuit board.

Furthermore, as a fourth arrangement of solution, the mounting fixture includes a male screw and a female screw. The female screw is formed in a cylindrical portion provided on the mounting leg, and the male screw inserted into the mounting hole in the circuit board is screwed into the female screw, thus forming the shield cover to the circuit board.

And furthermore as a fifth arrangement of solution, the contact position between the shield cover and the circuit pattern is set in the vicinity of the pin terminal.

DESCRIPTION OF THE PREFERRED EMBODIMENTS

Referring to FIGS. 1 to 6, the IC card connector grounding structure of the present invention will be explained. FIG.

Figure 1:
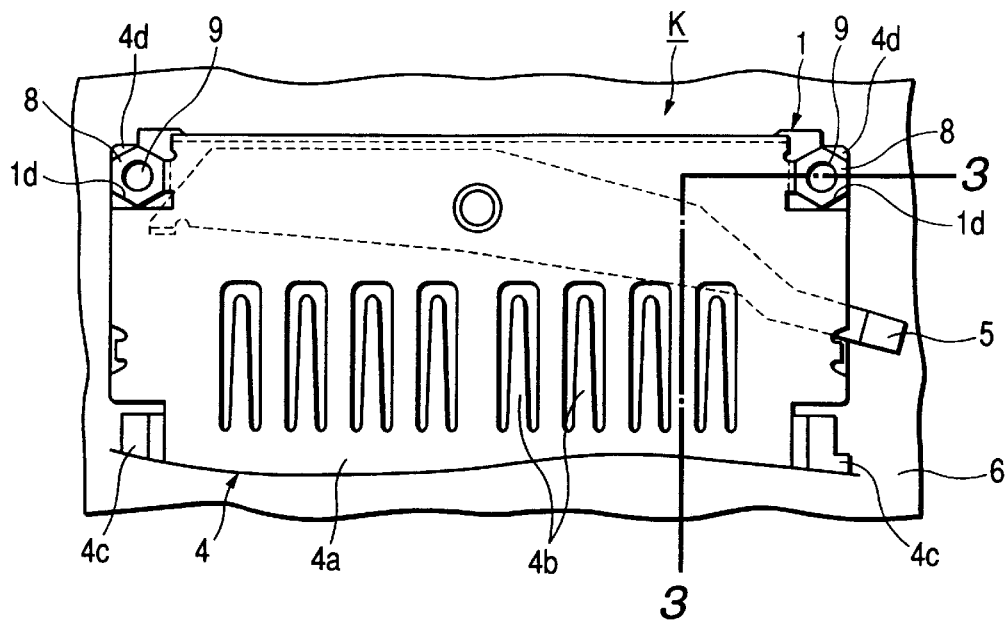
FIG. 1 is a plan view showing the IC card connector grounding structure of the present invention with an IC card connecto attached to a circuit board.
Figure 2:
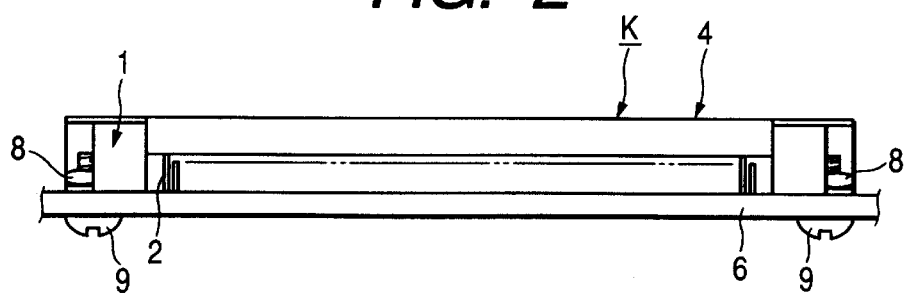
FIG. 2 is a rear view showing the IC card connector grounding structure of the present invention with the IC card connector attached to the circuit board.
Figure 3:
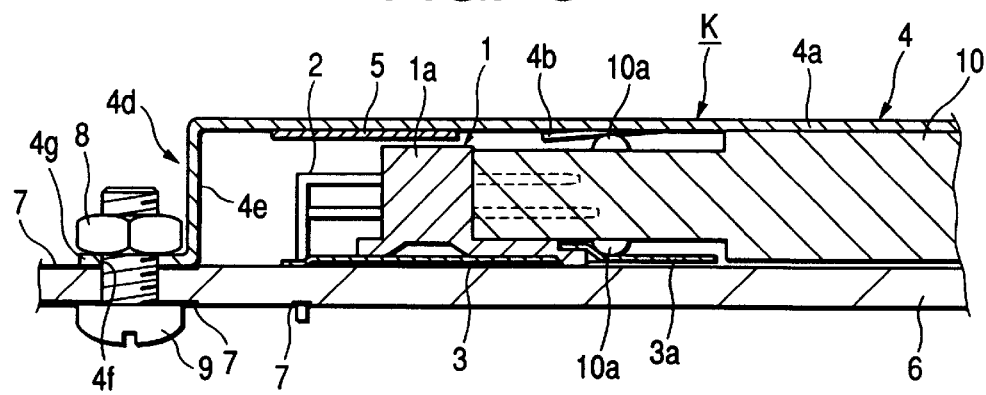
FIG. 3 is a sectional view taken along line 3—3 of FIG. 1.
Figure 4:
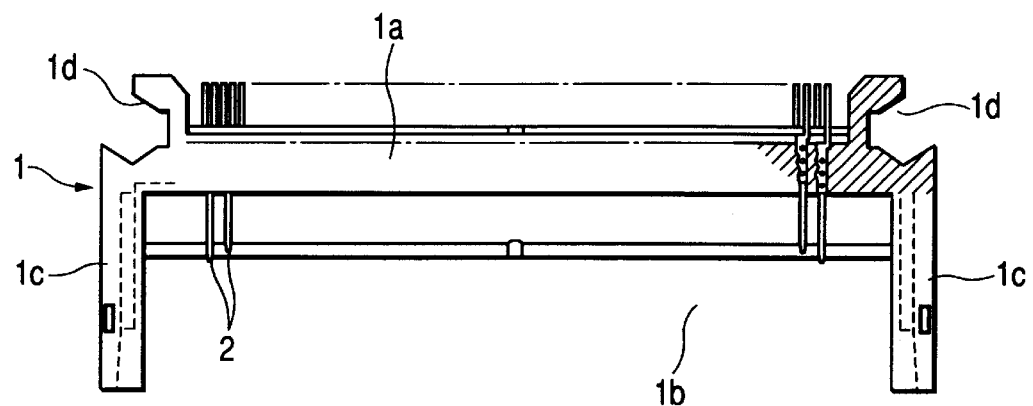
FIG. 4 is a plan view of a housing used in the IC card connector grounding structure of the present invention.
Figure 5:
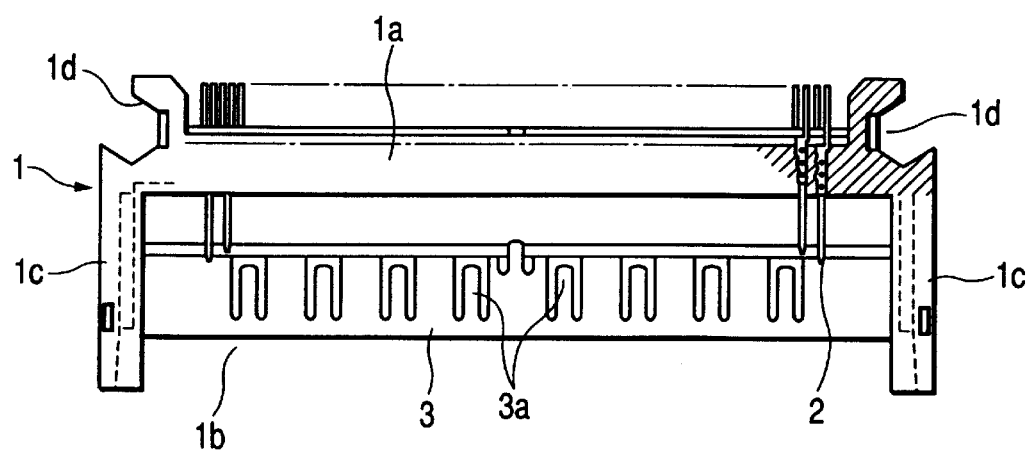
FIG. 5 is a plan view showing the IC card connector grounding structure of the present invention with a shroud plate attached to the housing.
Figure 6:
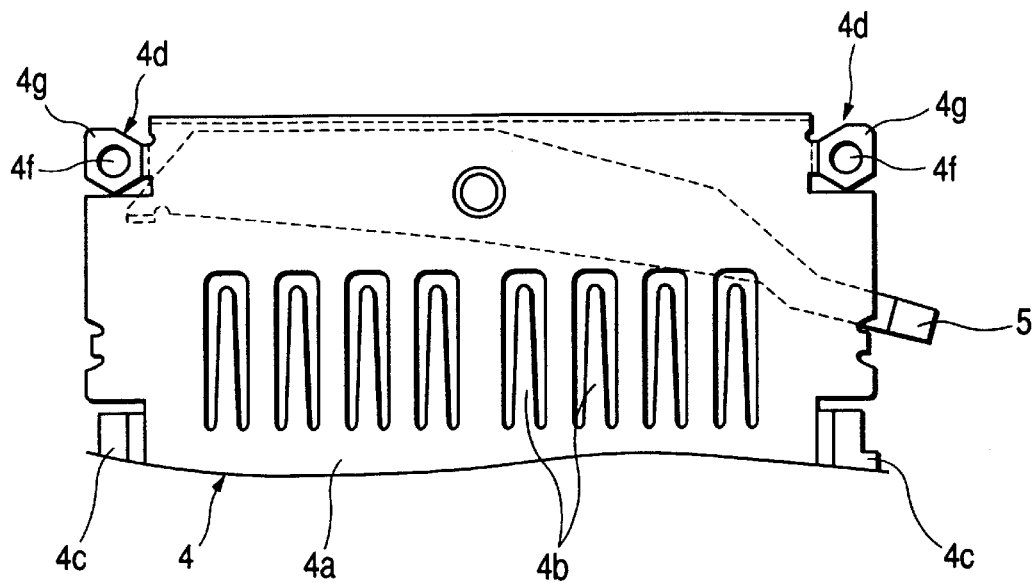
FIG. 6 is a plan view of a shield cover used in the IC card connector grounding structure of the present invention.

1 is a plan view of the IC card connector grounding structure of the present invention, showing the IC card connector attached to the circuit board. FIG. 2 is a rear view thereof. FIG. 3 is a sectional view taken along line 3—3 of FIG. 1. FIG. 4 is a plan view of the housing used in the IC card connector grounding structure according to the present invention. FIG. 5 is a plan view of the IC card connector grounding structure of the present invention with the shroud plate attached to the housing. And FIG. 6 is a plan view of the shield cover used in the IC card connector grounding structure according to the present invention.

Next, to explain the IC card connector grounding structure of the present invention, an U-shaped housing 1 made of an insulating molding, particularly as shown in FIGS. 4 and 5, has a base portion 1a, a guide side wall 1c provided oppositely on both ends of the base portion 1a and forming a housing section 1b, and a square cutout portion 1d provided at the rear corner of the base portion 1a.

A plurality of L-shaped pin terminals 2 are embedded in a base portion 1a of the housing 1, projecting at one end into the housing section 1b and at the other end from the rear of the base portion 1a.

The shroud plate (shield plate) 3 made of a resilient metal plate has a plurality of resilient arm portions 3a provided with holes formed in one row, and is attached on the housing 1, covering the underside of the housing 1.

The shield cover 4 made of a resilient metal plate, particularly as shown in FIG. 6, has a top plate section 4a, a plurality of resilient arm portions 4b provided with holes formed in one row in the top plate section 4a, an U-shaped guide sections 4c provided on both sides of the top plate section 4a, and a pair of mounting legs 4d formed at rear corners.

The mounting leg 4d is bent downwardly from the top plate section 4a, and is comprised of a leg portion 4e extending to the bottom end of the shield cover 4, and a hexagonal mounting portion 4g bent at the end of the leg portion 4e and having a hole 4f.

On the top plate section 4a of the shield cover 4, a lever 5 is rotatably attached.

The shield cover 4 of such a design is attached to the housing 1, covering the upper surface of the housing 1 with the mounting leg 4d aligned with the cutout portion 1d of the housing 1.

When the shield cover 4 is mounted, the mounting portion 4g of the mounting leg 4d is flush with the lower surface of the housing 1, or projecting a little downwardly. Also, the mounting leg 4g is disposed near the pin terminal 2.

The upper and lower surfaces of the housing 1 are shielded with the shield cover 4 and the shroud plate 3. The IC card connector K is comprised of the housing 1 holding the pin terminal 2, the shroud plate 3, the shield cover 4, and the lever 5.

The IC card connector K of such a design is mounted and used in an electronic apparatus such as a computer. In the electronic apparatus a circuit board 6 is provided.

On both sides of the circuit board 6 a circuit pattern 7 is arranged. Also near the upper and lower surfaces of the mounting hole 6a provided in the circuit board 6 the ground circuit pattern 7 is formed.

Mounting of the IC card connector K to the circuit board 6 is performed by first inserting the hexagonal nut 8 into the square cutout portion 1d and then mounting the nut 8 on the mounting portion 4g of the mounting leg 4d.

Then, the IC card connector K is placed on the circuit board 6, and the mounting portion 4g of the mounting leg 4d is placed in contact with the ground circuit pattern 7.

Next, after insertion of the screw 9 into the mounting hole 6a of the circuit board 6 and the hole 4f of the shield cover 4, the screw 9 is screwed onto the nut 8 and tightened, thereby mounting the IC card connector K on the circuit board 6.

Upon mounting of the IC card connector K, the mounting portion 4g of the shield cover 4 instantly contacts the ground circuit pattern 7 on the upper surface of the circuit board 6, thereby directly grounding the shield cover 4. Furthermore, the head of the screw 9 contacts the ground circuit pattern 7 provided on the lower surface of the circuit board 6. Thus the shield cover 4 is grounded to the circuit pattern 7 through the screw 9. The pin terminal 2 is in connection with the circuit pattern 7.

The IC card 10 used for communications and others through LAN and modem, as shown in FIG. 3, has a plurality of dimples 10a on the upper and lower surfaces. The IC card 10 is so designed as to be inserted into the shield cover 4 and the housing 1 and extracted therefrom. The IC card 10, when inserted into the IC card connector K, is connected to the pin terminal 2 as shown in FIG. 3 and at the same time the arm portion 3a of the shroud plate 3 and the arm portion 4b of the shield cover 4 elastically contacts the dimples 10a of the IC card 10, to thereby shield the vicinity of an unillustrated contactor of the IC card 10.

The lever 5 is operated by arrangement of a pushrod not depicted, to thereby extract the IC card 10 from the IC card connector 4.

The IC card connector K is used to perform high-speed transmission in communications.

It should be noticed that, in the above-described embodiment, the shield cover 4 is provided with the mounting legs 4d, which are adapted to contact the ground circuit pattern 7, and may be so designed as to contact, at other than the mounting leg 4, the ground circuit pattern 7.

Also it should be noticed that, in the embodiment described above, the mounting fixtures comprising the nut 8 and the screw 9 are used, and other types of fixtures such as grommets may be used.

Figure 7:
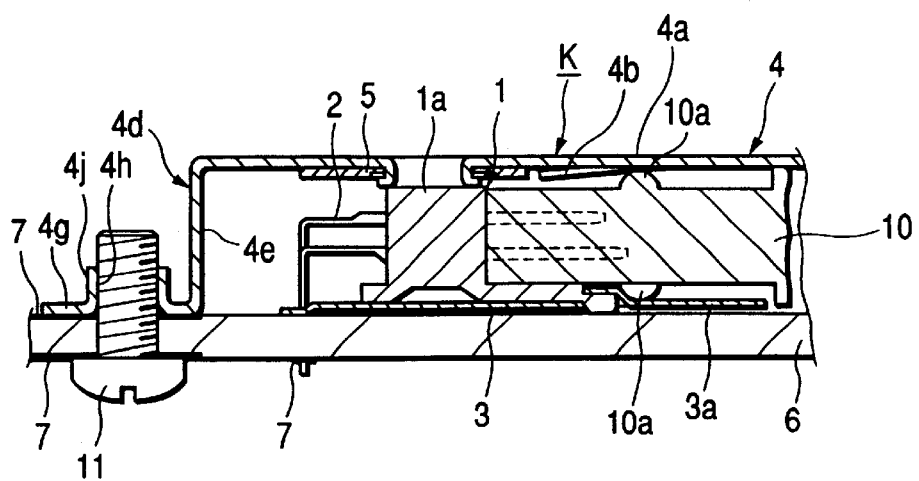
FIG. 7 is a sectional view showing another embodiment of the IC card connector grounding structure according to the present invention.
Figure 8:
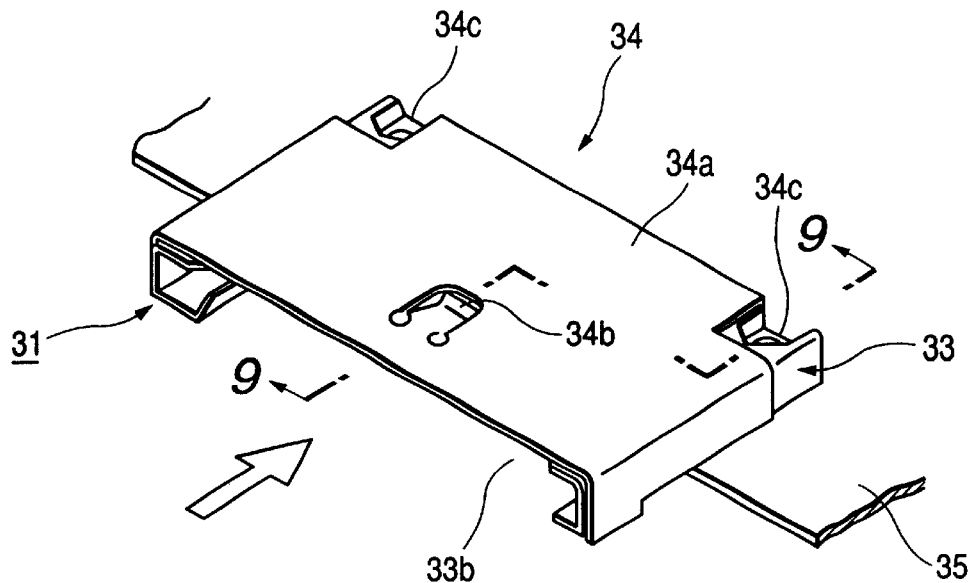
FIG. 8 is a perspective view showing a conventional IC card connector grounding structure.
Figure 9:
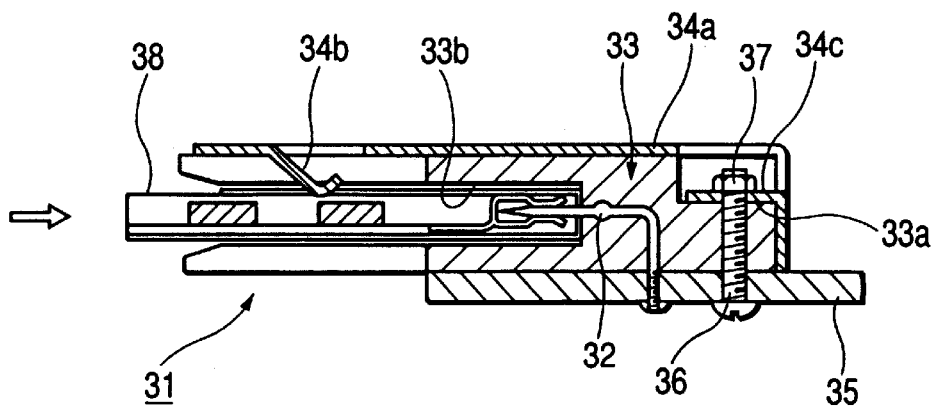
FIG. 9 is a sectional view taken along line 9—9 of FIG. 8.

FIG. 7 shows another embodiment of the IC card connector grounding structure according to the present invention. In this embodiment, a cylindrical portion 4j having the female screw 4h is provided in the mounting portion 4g constituting a part of the mounting leg 4d of the shield cover 4; and the male screw 11 inserted in the mounting hole 6a of the circuit board 6 is screwed into the female screw 4h of the cylindrical portion 4j, thus mounting the shield cover 4 to the circuit board 6.

At this time, similarly to the embodiment stated above, the mounting portion 4g of the shield cover 4 and the head of the male screw 11 are in direct contact with the ground circuit pattern 7 on the circuit board 6.

It should be noted that the same members as those in the above-described embodiments are designated by the same reference numerals and will not be explained.

According to the IC card connector grounding structure of the present invention, since the shield cover 4 is mounted in direct contact for grounding with the ground circuit pattern 7, it is possible to provide a grounding structure which is capable of acquiring satisfactory transmission performance to insure high-speed transmission with very little noise and without occurrence of inductance component unlike conventional structures.

Since the shield cover 4 is in direct contact with the circuit pattern 7, it is possible to provide a grounding structure of satisfactory high-speed transmission whereby the contact surface of the shield cover 4 can be freely increased in relation to the circuit pattern 7 to thereby enable stabilized grounding.

Furthermore, the shield cover 4 is provided with the mounting legs 4d, and is attached by mounting fixtures with the mounting legs 4d held in contact with the circuit pattern 7. It is, therefore, possible to provide a grounding structure which ensures reliable contact of the shield cover 4 with the circuit pattern 7 and satisfactory grounding of the shield cover 4.

Furthermore, it is possible to provide a grounding structure in which the mounting fixture is comprised of the nut 8 and the screw 9, to thereby allow removal of the IC card connector K, and to ensure reliable grounding of the shield cover 4. Reliable grounding of the shield cover 4 is achieved even after removal and repair of the IC card connector K.

Furthermore, since the mounting fixture is comprised of the male screw 11 and the female screw 4h formed in the cylindrical portion 4j of the mounting leg 4d, the nut 8 which is another component can be dispensed with. It is, therefore, possible to provide a grounding structure which can readily be installed and removed, and ensure reliable grounding of the shield cover 4 and accordingly reliable grounding of the shield cover 4 even after removal and repair of the IC card connector K.

Furthermore, since the contact position between the shield cover 4 and the circuit pattern 7 is set in the vicinity of the pin terminal 2 through which signals are read from, and stored into, the IC card 10, it is possible to provide a grounding structure which is suitable for high-speed transmission with further improved shielding effect.

What is claimed is:

1. An IC card connector grounding structure, comprising:
    an IC card connector having a housing made of an insulating material in which a plurality of pin terminals are arranged in rows and held in position by said housing;
    a shield cover mounted on an upper surface of said housing; and
    a circuit board having a ground circuit pattern, said IC card connector being mounted on said circuit board;
    wherein said housing is formed with a pair of cutout portions passing from the upper surface to a lower surface thereof, one of said cutout portions being formed at each end of said rows of pin terminals, and wherein said shield cover comprises a pair of mounting legs formed by folding opposing edges of said shield cover downwardly so that each of said mounting legs is disposed within one of said cutout portions, each of said mounting legs being formed with a mounting portion in direct surface contact with said circuit pattern each of said mounting portions having an outer edge that interlocks with a circumferential edge of said cutout portions, and wherein said circuit board comprises a pair of mounting holes, each said mounting hole being engaged by a screw inserted through said mounting hole from a rear surface of said circuit board so as to engage the mounting portion of each said mounting leg and fasten said shield cover and said IC card connector to said circuit board.

2. An IC card connector grounding structure according to claim 1, wherein each of said mounting portions has a hexagonal outer shape, and the circumferential edge of each of said cutout portions is formed with an outer shape corresponding to the hexagonal shape of each mounting portion.

3. An IC card connector grounding structure according to claim 2, wherein the circuit pattern is formed around a circumference of each said mounting hole at a front surface and the rear surface of said circuit board, and a nut is disposed within each of said cutout portions to fasten each of said screws, a head part of each of said screws being in direct surface contact with the rear surface of said circuit pattern and each of said mounting portions being in direct surface contact with the front surface of said circuit pattern.

4. An IC card connector grounding structure according to claim 1, wherein each of said mounting portions comprises outwardly extending cylindrical portion having a threaded hole, each of said screws being screwed into said threaded holes from the rear surface side of said circuit board so as to engage the mounting portion of each said mounting leg and fasten said shield cover to said circuit board.

* * * * *